(12) United States Patent
Sueyasu et al.

(10) Patent No.: US 9,393,776 B2
(45) Date of Patent: Jul. 19, 2016

(54) SCREEN PRINTING APPARATUS

(71) Applicant: Panasonic Intellectual Property Management Co., Ltd., Osaka (JP)

(72) Inventors: Yusuke Sueyasu, Yamanashi (JP); Masahiro Morimoto, Yamanashi (JP); Takaaki Sakaue, Yamanashi (JP); Koji Okawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1 day.

(21) Appl. No.: 14/715,932

(22) Filed: May 19, 2015

(65) Prior Publication Data

US 2015/0336377 A1     Nov. 26, 2015

(30) Foreign Application Priority Data

May 26, 2014  (JP) ................................. 2014-107753

(51) Int. Cl.
| | |
|---|---|
| *B41F 15/40* | (2006.01) |
| *B41F 15/42* | (2006.01) |
| *B41F 15/36* | (2006.01) |
| *B41F 15/44* | (2006.01) |
| *B41F 15/26* | (2006.01) |
| *B05C 17/06* | (2006.01) |
| *B05C 17/08* | (2006.01) |
| *H05K 3/00* | (2006.01) |
| *B41F 15/46* | (2006.01) |
| *B41F 15/08* | (2006.01) |

(52) U.S. Cl.
CPC ................. *B41F 15/46* (2013.01); *B41F 15/08* (2013.01); *B41F 15/26* (2013.01); *B41F 15/36* (2013.01); *B41F 15/40* (2013.01); *B41F 15/44* (2013.01); *B05C 17/06* (2013.01); *B05C 17/08* (2013.01); *B41F 15/42* (2013.01); *B41F 15/426* (2013.01); *H05K 2203/0139* (2013.01)

(58) Field of Classification Search
CPC ............. B41F 5/46; B41F 5/44; B41F 15/42; B41F 15/426; B05C 17/06; B05C 17/08; H05K 2203/0139
See application file for complete search history.

(56) References Cited

U.S. PATENT DOCUMENTS

| 3,089,175 | A | * | 5/1963 | Hinder ........................ 15/250.43 |
| 4,955,298 | A | * | 9/1990 | Zimmer et al. ................ 101/120 |
| 2013/0239829 | A1 | | 9/2013 | Kobayashi et al. |

FOREIGN PATENT DOCUMENTS

JP          2013-123891 A      6/2013

* cited by examiner

*Primary Examiner* — John Fitzgerald
*Assistant Examiner* — John M Royston
(74) *Attorney, Agent, or Firm* — Pearne & Gordon LLP

(57) ABSTRACT

A screen printing apparatus includes: a barrier member which butts against a screen mask and a squeegee to prevent paste on the screen mask from escaping to an outside of a printing width of the board; and an urging mechanism which urges the barrier member toward the screen mask. The urging mechanism includes: a first magnetic member held by the squeegee head such that a first pole surface having a first magnetic pole is directed toward the barrier member; and a second magnetic member held by the barrier member such that a second pole surface having a second magnetic pole opposite to the first magnetic pole is directed toward the first magnetic member, whereby the urging mechanism urges the barrier member by an attracting magnetic force acting between the first pole surface and the second pole surface.

3 Claims, 7 Drawing Sheets

SCREEN PRINTING APPARATUS

CROSS-REFERENCES TO RELATED APPLICATION(S)

This application is based on and claims priority from Japanese Patent Application No. 2014-107753 filed on May 26, 2014, the entire contents of which are incorporated herein by reference.

BACKGROUND

1. Field of the Invention

One or more embodiments of the present invention relate to a screen printing apparatus which prints paste such as cream solder or electrically conductive paste onto a board.

2. Description of Related Art

In an electronic component mounting step, screen printing is used as a method of printing paste such as cream solder, electrically conductive paste, etc., onto a board. In the method, a screen mask in which pattern holes are opened in accordance with print target positions is set on a board, paste is supplied onto the screen mask, and, when a squeegee is then slid, the paste is printed onto the board via the pattern holes. In the screen printing, the paste supplied onto the screen mask is scraped by the squeegee to be supplied to the whole printing width of the board. In the squeegeeing operation, the paste is scraped in the travel direction of the squeegee, and gradually pushed toward the outside along the surface of the squeegee. If the paste is moved to the outside range of the width dimension of the board, the paste in the outside range is not scraped by the squeegee and remains therein, since the screen mask in the outside range is not supported from the lower side and therefore easily warps. This may avoid normal squeegeeing operation.

In order to prevent the disadvantage from occurring, for example, JP-A-2013-123891 describes a screen printing apparatus which includes barrier members disposed on a squeegee at an interval corresponding to the printing width of a board, and which has a function of preventing paste on a screen mask from escaping to the outside of the printing width. In the screen printing apparatus, the barrier members are urged against the squeegee and the screen mask to restrict escape of the paste during the squeegeeing operation.

SUMMARY

However, the screen apparatus described in JP-A-2013-123891 has the below-described disadvantage due to the system in which the barrier members are urged. In the screen printing apparatus, the compression springs are used to urge the barrier members along the squeegee, and therefore the paste leaks through gaps between the barrier members and the squeegee, with the result that the effect of preventing the paste from escaping is not sufficiently achieved. Further, when the screen printing work is continued, it is inevitable to avoid a situation where the paste enters into and adheres to the interiors of the compression springs, and the spring force is lowered or varied by the paste. Therefore, it is difficult to ensure the adequate pressing forces of the barrier members to stabilize the effect of barrier to the paste, and maintenance works such as adjustment of the attachment states of the compression springs, and cleaning for removal of the paste must be performed. Consequently, it is requested to improve the workability. As described above, the above-described screen printing apparatus having the configuration where the barrier members are pressed against the screen mask to prevent paste from escaping to the outside of the printing width has problems in that the effect of preventing the paste from escaping is unstable, and the workability of maintenance work and the like is low.

An object of one or more embodiments of the invention is to provide a screen printing apparatus in which the effect of preventing paste on a screen mask from escaping to the outside of the printing width is stabilized, and the workability of maintenance work is improved.

In an aspect of the invention, there is provided a screen printing apparatus which prints paste onto a board via pattern holes formed in a screen mask by a squeegeeing operation of sliding a squeegee on the screen mask on which the paste is supplied and which contacts the board, the screen printing apparatus including: a board positioning unit which holds and positions the board with respect to the screen mask; a screen printing mechanism which moves vertically and horizontally a squeegee head on which the squeegee is disposed to perform the squeegeeing operation; a barrier member which is disposed on the squeegee head to extend toward a travel direction of the squeegee during the squeegeeing operation, and which butts against an upper surface of the screen mask and the squeegee, such that the paste on the screen mask is prevented from escaping to an outside of a printing width of the board; and a pressing mechanism which urges the barrier member toward the screen mask, wherein the pressing mechanism includes: a guide shaft which is placed in parallel to the squeegee, and which guides the barrier member along a movement direction during pressing by the pressing mechanism; and an urging mechanism which urges the barrier member in an axial direction of the guide shaft, and wherein the urging mechanism includes: a first magnetic member including a first pole surface having a first magnetic pole and held by the squeegee head such that the first pole surface is directed toward the barrier member; and a second magnetic member including a second pole surface having a second magnetic pole opposite to the first magnetic pole and held by the barrier member such that the second pole surface is directed toward the first magnetic member, whereby the urging mechanism urges the barrier member by an attracting magnetic force acting between the first pole surface and the second pole surface.

According to an aspect of the invention, it is possible to provide a screen printing apparatus in which the effect of preventing paste on a screen mask from escaping to the outside of the printing width is stabilized, and the workability of maintenance work is improved.

DETAILED DESCRIPTION

Figure 1:
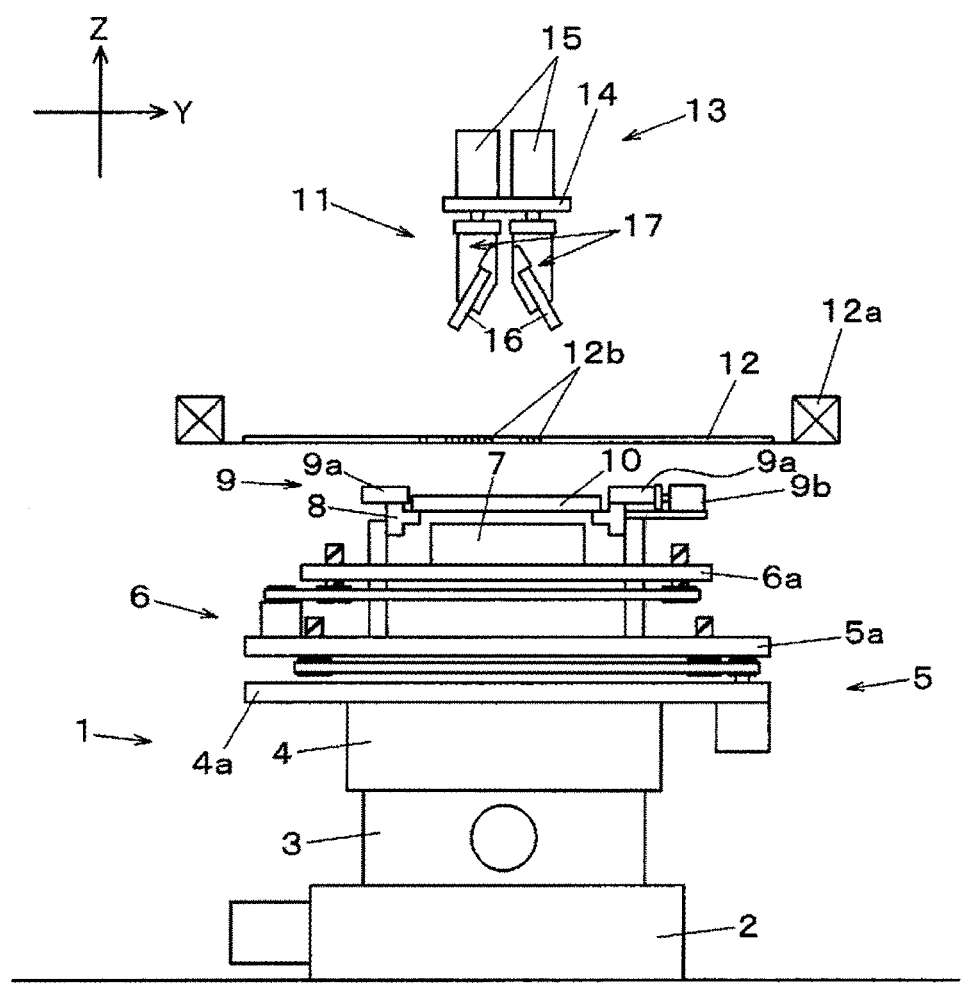
FIG. 1 is a side view of a screen printing apparatus of an embodiment of the invention.

Next, an embodiment of the invention will be described with reference to the drawings. First, the structure of a screen printing apparatus will be described with reference to FIGS. 1 to 3B. Referring to FIG. 1, the screen printing apparatus is configured by placing a screen printing mechanism 11 above a board positioning unit 1. The board positioning unit 1 is configured by stacking a Y-axis table 2, an X-axis table 3, and a θ-axis table 4, and further stacking on them a combination of a first Z-axis table 5 and a second Z-axis table 6.

The configuration of the first Z-axis table 5 will be described. On the side of the upper surface of a horizontal base plate 4a which is disposed on the upper surface of the θ-axis table 4, a horizontal base plate 5a is held to be movable up and down by an elevation guiding mechanism (not shown). The base plate 5a moves up and down by a Z-axis elevating mechanism, and a board transporting mechanism 8 is held to an upper end portion of a vertical frame which is erected from the base plate 5a. The board transporting mechanism 8 includes two transportation rails which are disposed in parallel to the board transporting direction (X direction, the direction perpendicular to the sheet in FIG. 1). The transportation rails support both end portions of a board 10 which is a print target, and transport the board.

Figure 2:
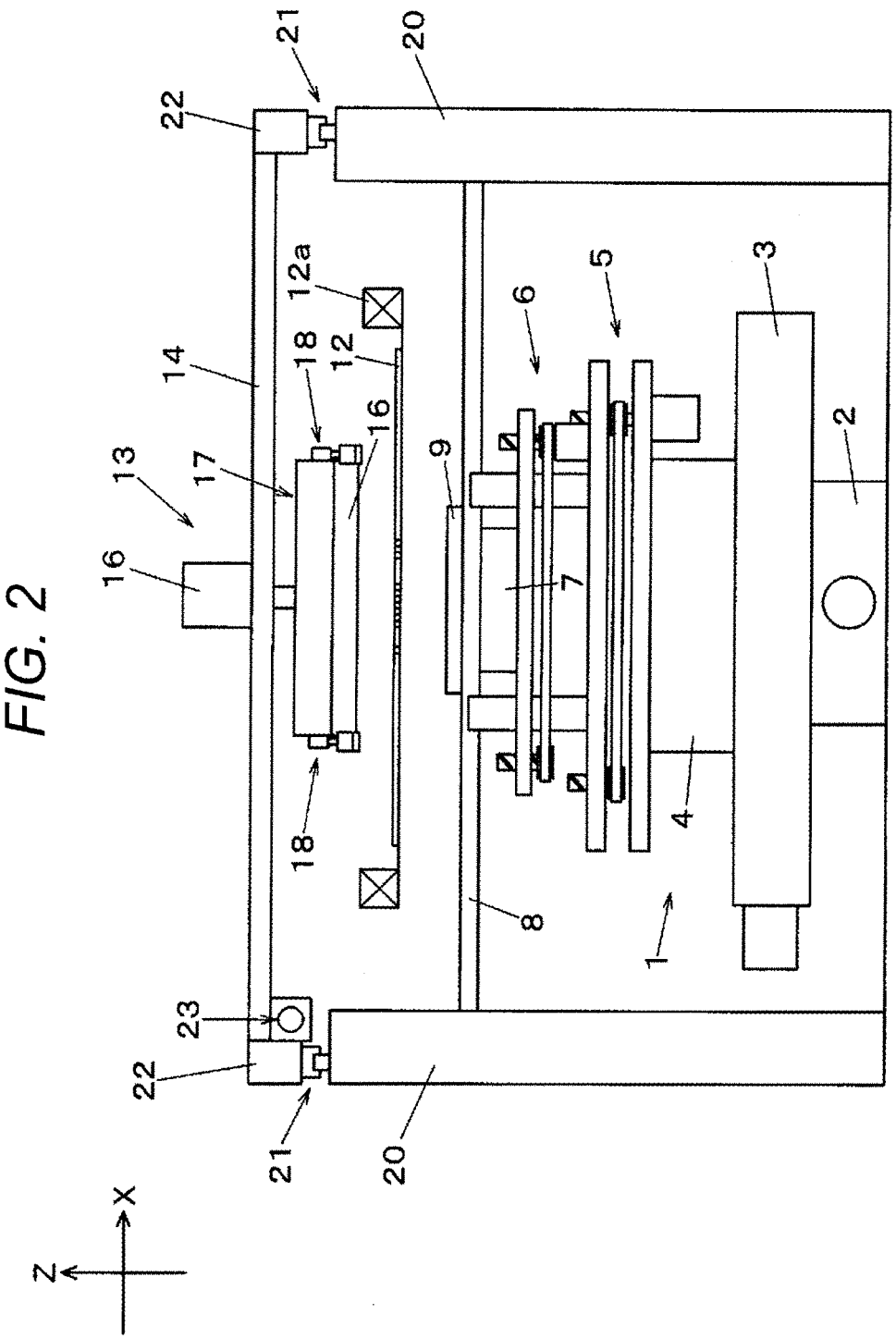
FIG. 2 is a front view of the screen printing apparatus of the embodiment of the invention.
Figure 3A:
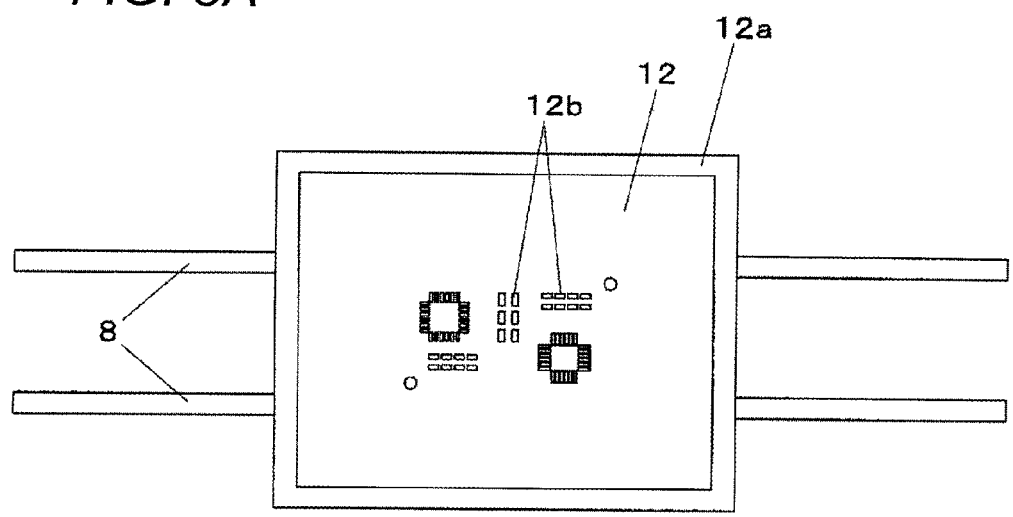
FIGS. 3A and 3B are plan views of the screen printing apparatus of the embodiment of the invention.
Figure 3B:
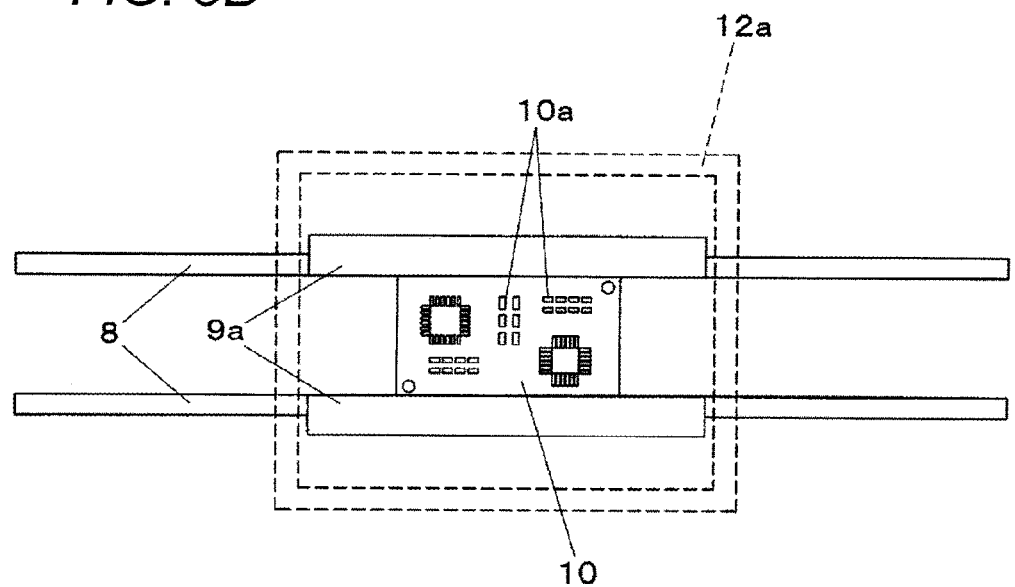

When the first Z-axis table 5 is driven, the board 10 held by the board transporting mechanism 8 can move up and down together with the board transporting mechanism 8 with respect to the screen printing mechanism 11. As shown in FIGS. 2 to 3B, the board transporting mechanism 8 elongates toward the upstream side (the left side in FIGS. 2 to 3B) and the downstream side. The board 10 which is carried in from the upstream side is transported by the board transporting mechanism 8, and then positioned by the board positioning unit 1. A printing process is performed on the board 10 by the screen printing mechanism 11, and thereafter the board 10 is carried out to the downstream side by the board transporting mechanism 8.

The configuration of the second Z-axis table 6 will be described. Between the board transporting mechanism 8 and the base plate 5a, a horizontal base plate 6a is disposed so as to be movable up and down along an elevation guiding mechanism (not shown). The base plate 6a moves up and down by a Z-axis elevating mechanism. A board under-supporting unit 7 including an upper surface serving as an under-supporting surface for holding the board 10 is disposed on the upper surface of the base plate 6a.

When the second Z-axis table 6 is driven, the board under-supporting unit 7 moves up and down with respect to the board 10 held by the board transporting mechanism 8. Then, the under-supporting surface of the board under-supporting unit 7 butts against the lower surface of the board 10, thereby allowing the board under-supporting unit 7 to support the lower surface of the board 10. A clamping mechanism 9 is disposed on the upper surface of the board transporting mechanism 8. The clamping mechanism 9 includes two clamping members 9a which are placed so as to be laterally opposed to each other. When one of the clamping members 9a is advanced or refracted by a driving mechanism 9b, the board 10 is clamped from the both sides to be fixed.

Next, the screen printing mechanism 11 disposed above the board positioning unit 1 will be described. Referring to FIGS. 1 and 2, a screen mask 12 is extended in a mask frame 12a, and pattern holes 12b are formed in the screen mask 12 in accordance with the shapes and positions of electrodes 10a (see FIG. 3B) which are print targets in the board 10. A squeegee head 13 is disposed above the screen mask 12. In the squeegee head 13, a squeegee elevating mechanism 15 for moving up and down a squeegee 16 held by a squeegee holder 17 is disposed on a horizontal moving plate 14. When the squeegee elevating mechanism 15 is driven, the squeegee 16 moves up and down together with the squeegee holder 17, and butts against the upper surface of the screen mask 12. In the squeegee head 13, escape preventing mechanisms 18 for preventing cream solder from escaping to the outside are disposed in both end portions of the squeegee holder 17, respectively.

As shown in FIG. 2, the moving plate 14 is coupled through coupling members 22 to guide rail mechanisms 21 which are disposed in the Y direction on vertical frames 20. According to the configuration, the moving plate 14 is slidable in the Y direction, and when a Y-axis moving mechanism 23 is driven, the squeegee head 13 is horizontally moved in the Y direction.

Figure 4A:
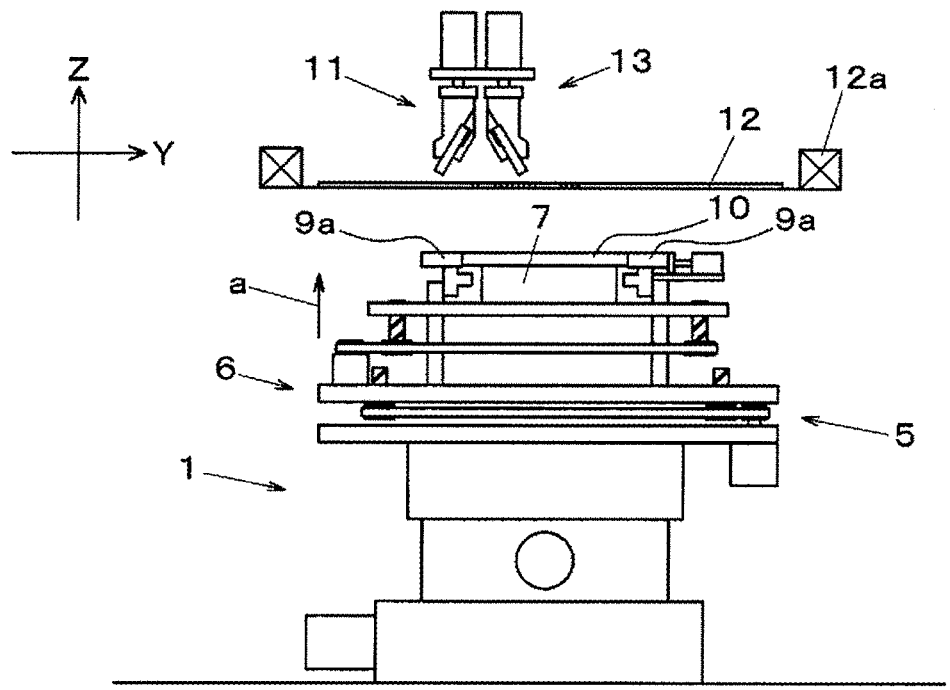
FIGS. 4A and 4B are views illustrating the operation of the screen printing apparatus of the embodiment of the invention.

Next, the printing operation by the screen printing mechanism 11 will be described with reference to FIGS. 4A and 4B. When the board 10 is carried in to a printing position by the board transporting mechanism 8, first, the second Z-axis table 6 is driven to move up the board under-supporting unit 7 (the arrow a), the lower surface of the board 10 is supported from the lower side as shown in FIG. 4A, and the board 10 is held and clamped between the clamping members 9a. In this state, then, the board positioning unit 1 is driven to position the board 10 with respect to the screen mask 12.

Figure 4B:
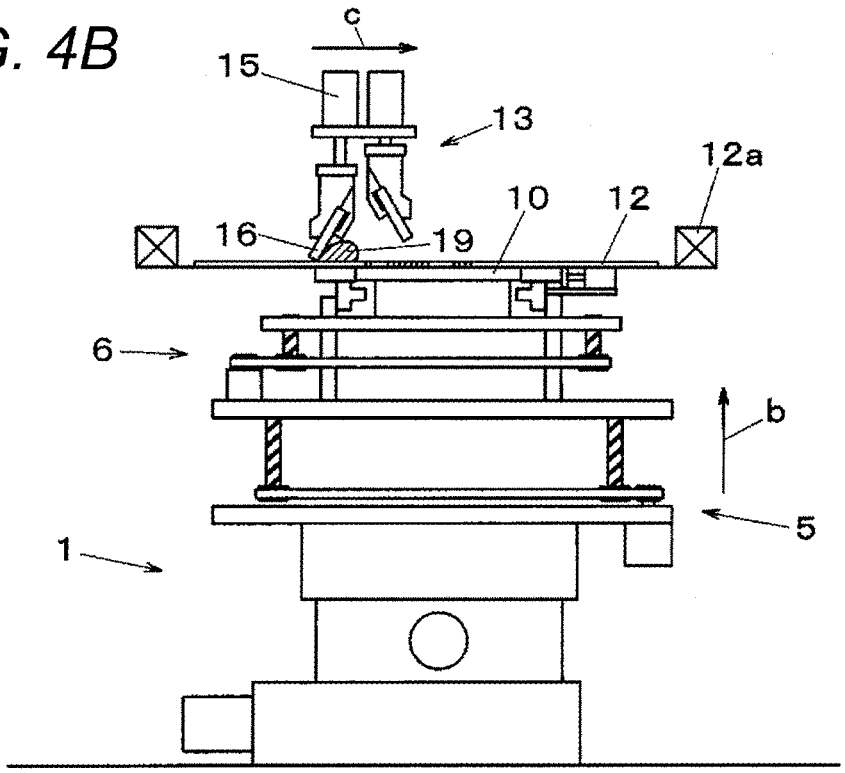

As shown in FIG. 4B, then, the first Z-axis table 5 is driven to move up the board 10 together with the board transporting mechanism 8 (the arrow b) to butt against the lower surface of the screen mask 12. In the squeegeeing operation by the squeegee head 13, therefore, the board 10 is positioned and fixed with respect to the screen mask 12. In this state, then, the squeegee 16 is slid on the screen mask 12 to which cream solder 19 serving as an example of paste is supplied (the arrow c), whereby the cream solder 19 is printed onto the board 10 via the pattern holes 12b.

Figure 5A:
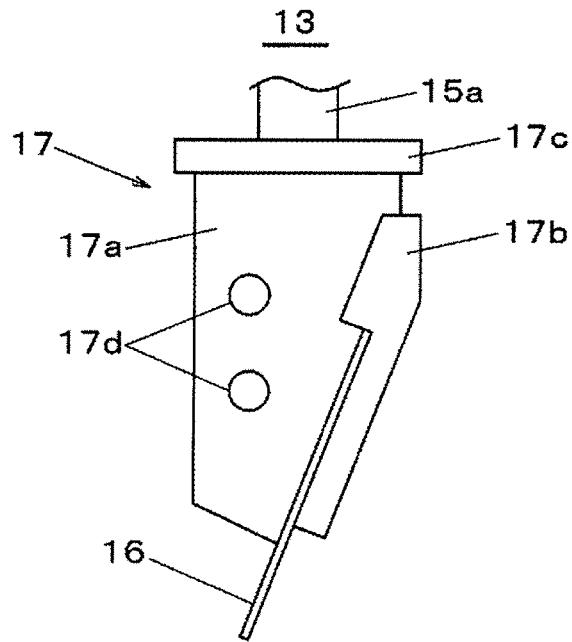
FIGS. 5A and 5B are views illustrating the configuration of a barrier mechanism in the screen printing apparatus of the embodiment of the invention.

Referring to FIGS. 5A to 7B, next, the configuration of the squeegee head 13, and the configuration and function of the escape preventing mechanisms 18 attached to the both end surfaces of the squeegee head 13 will be described. As shown in FIG. 5A, in the squeegee head 13, the plate-like squeegee 16 is held to be inclined in the squeegeeing direction (Y direction), through the squeegee holder 17 by an elevation driving shaft 15a which extends downward from the squeegee elevating mechanism 15. The squeegee holder 17 is coupled to the elevation driving shaft 15a through a coupling member 17c. The plate-like squeegee 16 is clamped and fixed between a holder basal portion 17a and a clamping member 17b which is disposed along the front surface of the holder basal portion 17a. The squeegee 16 is produced so as to have a width dimension in the X direction which corresponds to the printing width of the board 10.

Figure 5B:
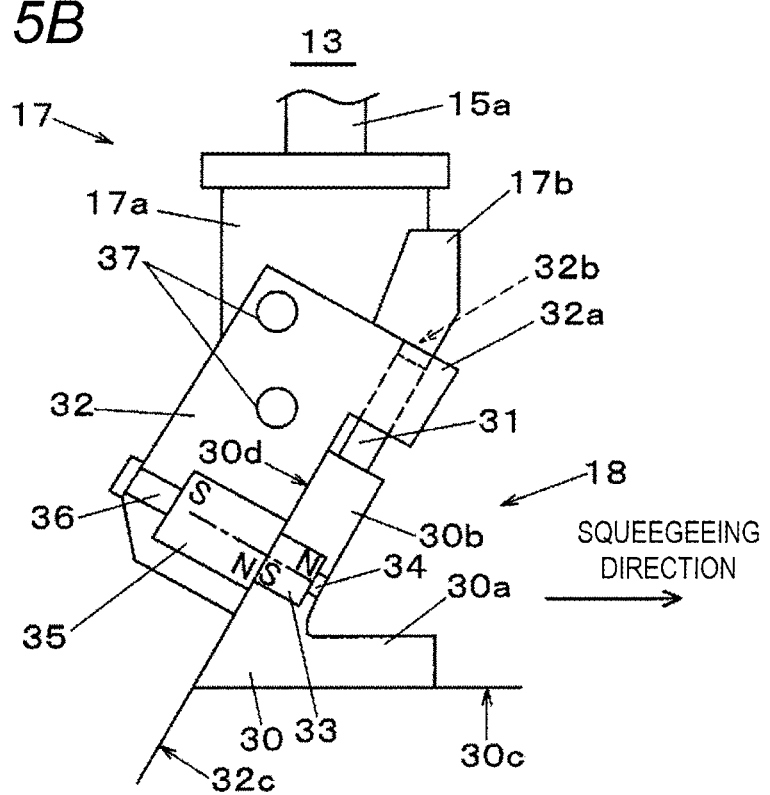

FIG. 5B shows a state where the escape preventing mechanisms 18 are attached to the both end portions of the squeegee holder 17, respectively. As shown in FIG. 5A, fastening holes 17d for attaching the escape preventing mechanisms 18 are formed in the holder basal portion 17a. When guiding members 32 are fastened to the both end portions of the squeegee holder 17 by fastening bolts 37, the escape preventing mechanisms 18 are disposed on the squeegee holder 17 at an interval of the width dimension in the X direction which corresponds to the printing width of the board 10.

In the embodiment, the escape preventing mechanisms 18 have a configuration where barrier members 30 are slidably held by the guiding members 32, and the barrier members 30 are pressed against the screen mask 12 by pressing mechanisms. In the configuration, the barrier members 30 have a function of butting against the upper surface of the screen mask 12 and the squeegee 16 to prevent the cream solder 19 on the screen mask 12 from escaping to the outside of the printing width.

Figure 6:
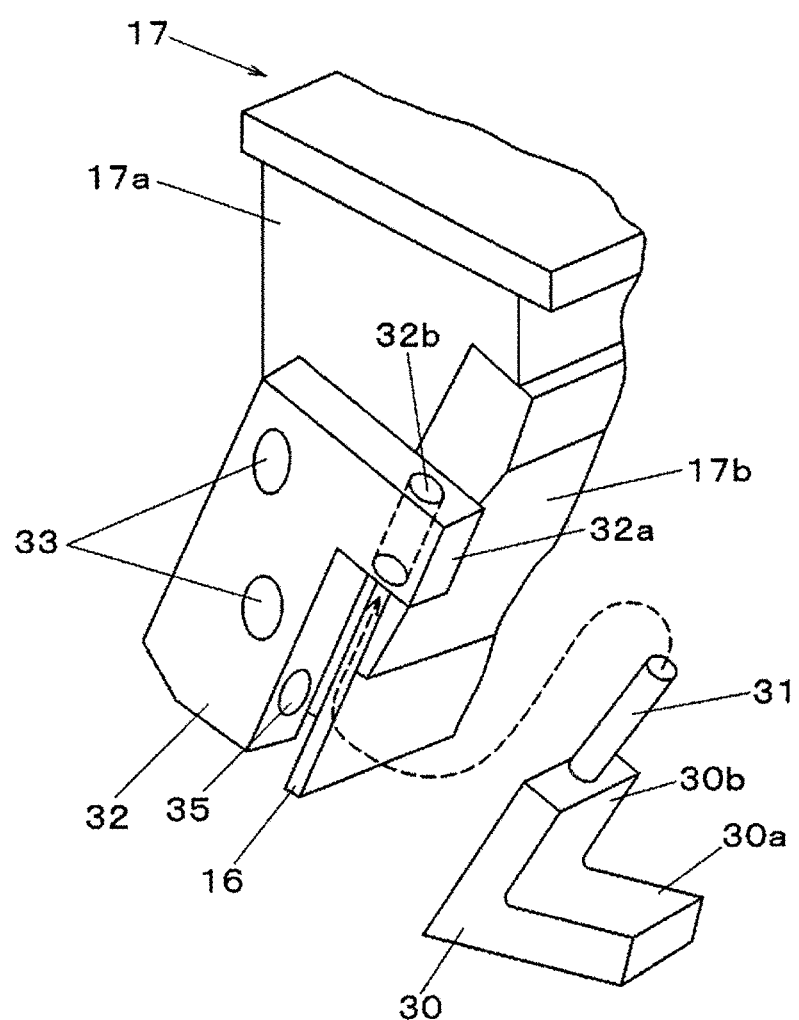
FIG. 6 is a perspective view of the barrier mechanism in the screen printing apparatus of the embodiment of the invention.

In a cross-sectional view, each of the barrier members 30 includes: a horizontal sliding contact portion 30a which butts against the screen mask 12 in the pressed state; and a slide portion 30b which is inclined at the same angle as the squeegee 16, and which butts against the guiding member 32. A guide shaft 31 for guidance in sliding with respect to the guiding member 32 extends from the upper surface of the slide portion 30b. As shown in FIG. 6, a guide hole 32b extends in parallel to the squeegee 16 and passed through an elongating portion 32a which elongates toward the squeegeeing direction in the state where the guiding member 32 is fastened to the holder basal portion 17a.

In order to allow the guiding member 32 to hold the barrier member 30, as shown in FIG. 6, the guide shaft 31 is fitted into the guide hole 32b from the side of the lower surface. In this state, a second sliding contact surface 30d of the slide portion 30b is in sliding contact with a first sliding contact surface 32c of the guiding member 32. Therefore, the barrier member 30 slidably held in parallel to the squeegee 16, and the guide shaft 31 has a function of guiding the barrier member 30 along the movement direction during pressing by the pressing mechanism. Namely, the pressing mechanism includes the guide shaft 31 which is placed in parallel to the squeegee 16, and which guides the barrier member 30 along the movement direction during pressing.

In the state where the barrier member 30 is attached, when the guide shaft 31 is pulled out from the elongating portion 32a, the barrier member 30 can be detached from the guiding member 32. That is, by fitting or unfitting the guide shaft 31 to or from the guiding member 32 held by the squeegee head 13 through the holder basal portion 17a, the barrier member 30 can be attached or detached in one operation.

Next, an urging mechanism for urging the barrier member 30 in the axial direction of the guide shaft 31 during the above-described pressing operation will be described. As shown in FIG. 5B, a first magnetic member 35 includes an N-pole surface serving as an example of a first pole surface having a first magnetic pole. The first magnetic member 35 is held by a fixing member 36 on the guiding member 32 fixed to the squeegee head 13 through the holder basal portion 17a such that the N-pole surface is directed toward the second sliding contact surface 30d of the barrier member 30. A second magnetic member 33 includes an S-pole surface serving as an example of a second pole surface having a second magnetic pole opposite to the first magnetic pole. The second magnetic member 33 is held on the barrier member 30 such that the S-pole surface is directed toward the first magnetic member 35. In the placement directions of the first magnetic member 35 and the second magnetic member 33, alternatively, the N-pole surface may be set as the second pole surface, and the S-pole surface may be set as the first pole surface.

In the above-described configuration, the second magnetic member 33 and the first magnetic member 35 are placed while the different pole surfaces oppose each other, and therefore an attracting magnetic force acts between the second magnetic member 33 and the first magnetic member 35. As a result, while no external force acts on the barrier member 30, the state where the center positions of the second magnetic member 33 and the first magnetic member 35 coincide with each other is most stable, and this stable state is maintained in the usual state where the squeegee holder 17 is located above and separated from the screen mask 12.

Figure 7A:
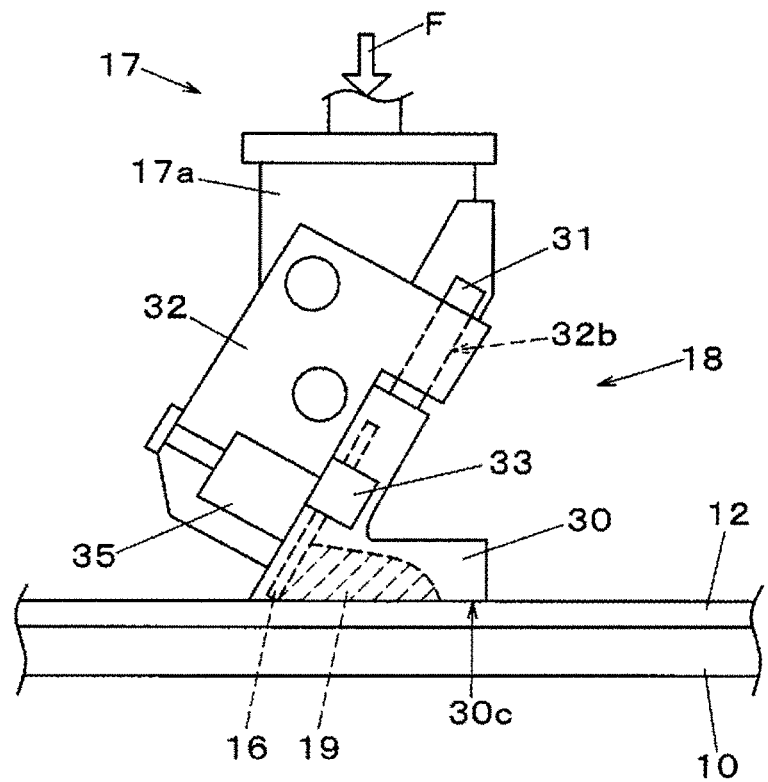
FIGS. 7A and 7B are views illustrating the function of the barrier mechanism in the screen printing apparatus of the embodiment of the invention.
Figure 7B:
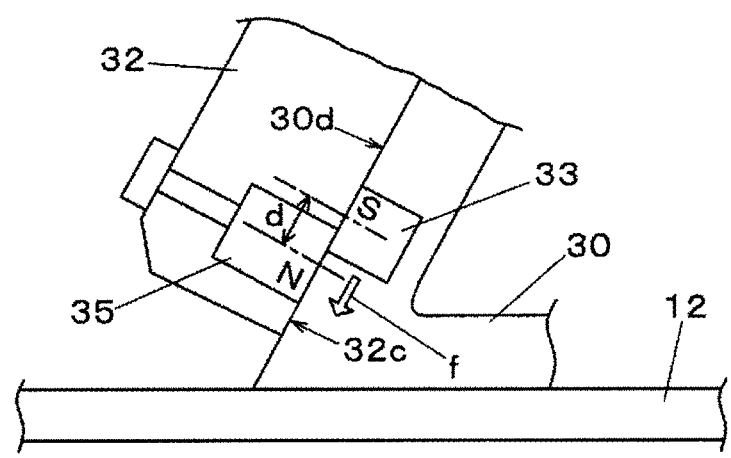

FIG. 7A shows the function of the escape preventing mechanisms 18 in screen printing in which the cream solder 19 is squeegeed by the squeegee 16 to be printed onto the board 10. In this state, in accordance with the printing pressure F acting on the squeegee holder 17, a push up force acts from the side of the lower surface on a butt surface 30c which butts against the screen mask 12. This causes the barrier members 30 to be slid along the guiding members 32 by a displacement distance corresponding to the printing pressure F, and a positional displacement d corresponding to the sliding distance is produced between the centers of the first magnetic member 35 and the second magnetic member 33 as shown in FIG. 7B. The positional displacement d functions so as to generate an attracting magnetic force f between the first magnetic member 35 and the second magnetic member 33, and the barrier member 30 is urged by the attracting magnetic force f against the screen mask 12.

In the embodiment, the urging mechanism for urging the barrier member 30 in the axial direction of the guide shaft 31 includes the first magnetic member 35 which is held by the squeegee head 13 through the holder basal portion 17a in the attitude in which the N-pole surface (first pole surface) is directed toward the barrier member 30, and the second magnetic member 33 which is held by the barrier member 30 in the attitude in which the S-pole surface (second pole surface) is directed toward the first magnetic member 35. The urging mechanism is configured so that the barrier member 30 is urged in the axial direction of the guide shaft 31 by the attracting magnetic force f acting between the first pole surface and the second pole surface.

According to the configuration, in screen printing, the barrier members 30 can be pressed against the screen mask 12 by an adequate pressing force, and made in close contact with the guiding members 32 by the attracting magnetic force acting between the second magnetic member 33 and the first magnetic member 35. In screen printing, therefore, it is possible to achieve a satisfactory escape preventing effect. Moreover, the embodiment does not use a mechanism element having a complicated shape which is easily contaminated by adhesion of cream solder, such as the spring that is used as urging mechanism in the related-art apparatus. In the embodiment, even when the barrier members 30 are contaminated by, for example, adhesion of cream solder, the barrier members 30 can be easily remove, and a maintenance work such as cleaning can be performed.

While the invention has been described with respect to a specific embodiment, the invention is not limited thereto. For example, the embodiment shows a pair of barrier members 30 provided at an interval corresponding to the printing width of the board, but the barrier member may be formed by a single member having opposing walls with the interval corresponding to the printing width of the board so as to prevent the paste from escaping to the outside of the printing width.

The screen printing apparatus of one or more embodiments of the invention has advantages that the effect of preventing paste on a screen mask from escaping to the outside of the printing width is stabilized, and the workability of maintenance work can be improved, and is useful in the field where paste such as cream solder is printed onto a board.

What is claimed is:
1. A screen printing apparatus which prints paste onto a board via pattern holes formed in a screen mask by a squee- geeing operation of sliding a squeegee on the screen mask on which the paste is supplied and which contacts the board, said screen printing apparatus comprising:

a board positioning unit which holds and positions the board with respect to the screen mask;

a screen printing mechanism which moves vertically and horizontally a squeegee head on which the squeegee is disposed to perform the squeegeeing operation;

a barrier member which is disposed on the squeegee head to extend toward a travel direction of the squeegee during the squeegeeing operation, and which butts against an upper surface of the screen mask and the squeegee, such that the paste on the screen mask is prevented from escaping to an outside of a printing width of the board; and a pressing mechanism which urges the barrier member toward the screen mask, wherein the pressing mechanism comprises:

a guide shaft which is placed in parallel to the squeegee, and which guides the barrier member along a movement direction during pressing by the pressing mechanism; and an urging mechanism which urges the barrier member in an axial direction of the guide shaft, and wherein the urging mechanism comprises:

a first magnetic member comprising a first pole surface having a first magnetic pole and held by the squeegee head such that the first pole surface is directed toward the barrier member; and a second magnetic member comprising a second pole surface having a second magnetic pole opposite to the first magnetic pole and held by the barrier member such that the second pole surface is directed toward the first magnetic member, wherein the first pole surface of the first magnetic member abuts on the second pole surface of the second magnetic member.

2. The screen printing apparatus according to claim 1, wherein the barrier member is attachable or detachable in one operation by fitting or unfitting the guide shaft to or from the guiding member held by the squeegee head.

3. The screen printing apparatus according to claim 1, wherein a pair of barrier members are provided at an interval corresponding to the printing width of the board.

* * * * *